(12) United States Patent
Yu et al.

(10) Patent No.: US 9,460,988 B2
(45) Date of Patent: Oct. 4, 2016

(54) INTERCONNECT STRUCTURES

(71) Applicant: Taiwan Semiconductor Manufacturing Co., Ltd., Hsin-Chu (TW)

(72) Inventors: Chen-Hua Yu, Hsinchu (TW); Hai-Ching Chen, Hsinchu (TW); Tien-I Bao, Dayuan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 120 days.

(21) Appl. No.: 13/868,140

(22) Filed: Apr. 23, 2013

(65) Prior Publication Data

US 2013/0228927 A1 Sep. 5, 2013

Related U.S. Application Data

(62) Division of application No. 11/747,615, filed on May 11, 2007, now Pat. No. 8,446,012.

(51) Int. Cl.
| | |
|---|---|
| *H01L 23/48* | (2006.01) |
| *H01L 23/52* | (2006.01) |
| *H01L 29/40* | (2006.01) |
| *H01L 23/485* | (2006.01) |
| *H01L 21/768* | (2006.01) |
| *H01L 23/528* | (2006.01) |
| *H01L 23/532* | (2006.01) |

(52) U.S. Cl.
CPC ....... *H01L 23/485* (2013.01); *H01L 21/76826* (2013.01); *H01L 21/76832* (2013.01); *H01L 21/76834* (2013.01); *H01L 21/76835* (2013.01); *H01L 21/76898* (2013.01); *H01L 23/5283* (2013.01); *H01L 23/53223* (2013.01); *H01L 23/53238* (2013.01); *H01L 2924/0002* (2013.01)

(58) Field of Classification Search
CPC ................. H01L 2924/0002; H01L 2924/00; H01L 21/76826; H01L 21/76832; H01L 21/76834; H01L 21/76835; H01L 23/5283; H01L 23/53223; H01L 23/53238; H01L 21/76898; H01L 23/485
See application file for complete search history.

(56) References Cited

U.S. PATENT DOCUMENTS

| | | | |
|---|---|---|---|
| 6,207,556 B1 * | 3/2001 | Hsu | H01L 21/76801 257/E21.576 |
| 6,232,215 B1 * | 5/2001 | Yang | 438/622 |
| 7,402,519 B2 | 7/2008 | He et al. | |
| 2001/0035547 A1 * | 11/2001 | Isogai | H01L 21/76831 257/296 |
| 2002/0146899 A1 * | 10/2002 | Chun | H01L 21/76831 438/618 |
| 2005/0280040 A1 | 12/2005 | Kasko et al. | |
| 2007/0037336 A1 | 2/2007 | Kwon et al. | |
| 2007/0128783 A1 | 6/2007 | Ting et al. | |
| 2007/0257368 A1 | 11/2007 | Hussein et al. | |
| 2008/0079154 A1 | 4/2008 | Osaka et al. | |

\* cited by examiner

*Primary Examiner* — Meiya Li
(74) *Attorney, Agent, or Firm* — Duane Morris LLP

(57) ABSTRACT

A semiconductor structure includes a first dielectric layer over a substrate. At least one first conductive structure is within the first dielectric layer. The first conductive structure includes a cap portion extending above a top surface of the first dielectric layer. At least one first dielectric spacer is on at least one sidewall of the cap portion of the first conductive structure.

9 Claims, 26 Drawing Sheets

INTERCONNECT STRUCTURES

CROSS-REFERENCE TO RELATED APPLICATIONS

This application is a division of U.S. patent application Ser. No. 11/747,615, filed May 11, 2007, the entirety of which is incorporated by reference herein.

BACKGROUND OF THE INVENTION

1. Field of the Invention

The present invention relates, most generally, to semiconductor structures, and more particularly to interconnect structures.

2. Description of the Related Art

With advances in electronic products, semiconductor technology has been applied widely in manufacturing memories, central processing units (CPUs), liquid crystal displays (LCDs), light emitting diodes (LEDs), laser diodes and other devices or chip sets. In order to achieve high-integration and high-speed requirements, dimensions of semiconductor integrated circuits have been reduced and various materials, such as copper and ultra low-k dielectrics, have been proposed and are being used along with techniques for overcoming manufacturing obstacles associated with these materials and requirements. In order to achieve high-speed performance, dimensions of transistors have been shrinking. Also, multi-layer interconnect structures have been proposed and/or used to provide desired operational speeds of transistors.

FIG. 1A is a schematic cross-sectional view showing a traditional interconnect structure.

Referring to FIG. 1A, a low-k dielectric layer 110 is formed over a substrate 100. Conductive structures 120 are formed within the low-k dielectric layer 110. The conductive structures 120 and the low-k dielectric layer 110 have a substantially level surface. Then, an etch stop layer 130, a glue layer 140 and another low-k dielectric layer 150 are sequentially formed over the dielectric layer 110. Conductive structures 160 are then formed within the dielectric layer 150, the glue layer 140 and the etch stop layer 130.

The etch stop layer 130 and the glue layer 140 are dielectric layers having dielectric constants higher than those of the low-k dielectric layers 110 and 150. The presence of the etch stop layer 130 and the glue layer 140 within the interconnect structure may increase the inter or intra parasitic capacitances between adjacent conductive structures 120 and/or 160.

In order to solve the issue of parasitic capacitances, some structures without the etch stop layer 130 and/or the glue layer 140 (shown in FIG. 1A) are provided. Referring to FIG. 1B, the interconnect structure includes the low-k dielectric layer 110 formed over the substrate 100. The conductive structures 120 are formed within the low-k dielectric layer 110. The conductive structures 120 and the low-k dielectric layer 110 have a substantially level surface. Without forming the etch stop layer 130 and the glue layer 140 (shown in FIG. 1A), the low-k dielectric layer 150 is formed over the dielectric layer 110. The conductive structures 160 are then formed within the dielectric layer 150, contacting the conductive structures 120. Accordingly, the inter or intra parasitic capacitances within the interconnect structure can be desirably reduced.

Based on the foregoing, methods and structures for forming dies with multi-layer interconnect structures are desired.

SUMMARY OF THE INVENTION

In accordance with some exemplary embodiments, a semiconductor structure includes a first dielectric layer formed over a substrate. At least one first conductive structure is formed within the first dielectric layer. The first conductive structure includes a cap portion extending above a top surface of the first dielectric layer. At least one first dielectric spacer is formed on at least one sidewall of the cap portion of the first conductive structure.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

FIGS. 2H and 2I are schematic cross-sectional views showing an exemplary method of forming multiple spacers on sidewalls of the cap portion of the conductive structure.

DETAILED DESCRIPTION OF EXEMPLARY EMBODIMENTS

Figure 1A:
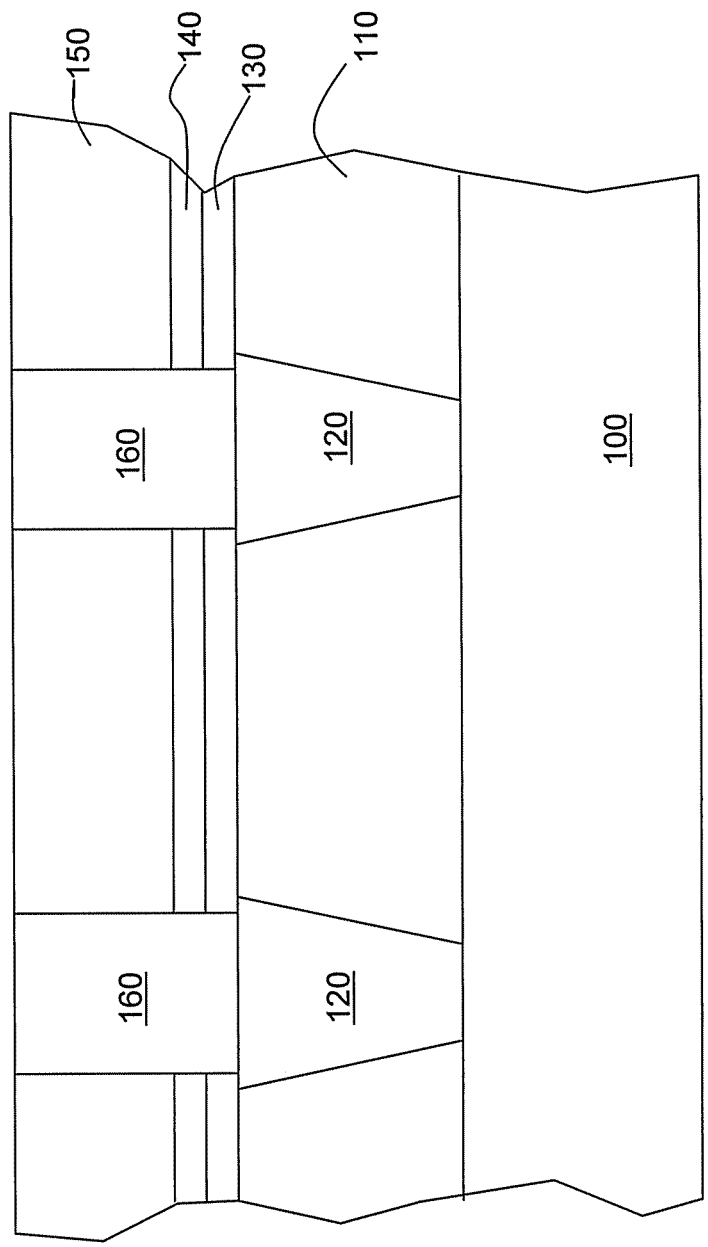
FIG. 1A is a schematic cross-sectional view showing a traditional interconnect structure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2G are schematic cross-sectional views showing an exemplary method for forming an interconnect structure.

Figure 2A:
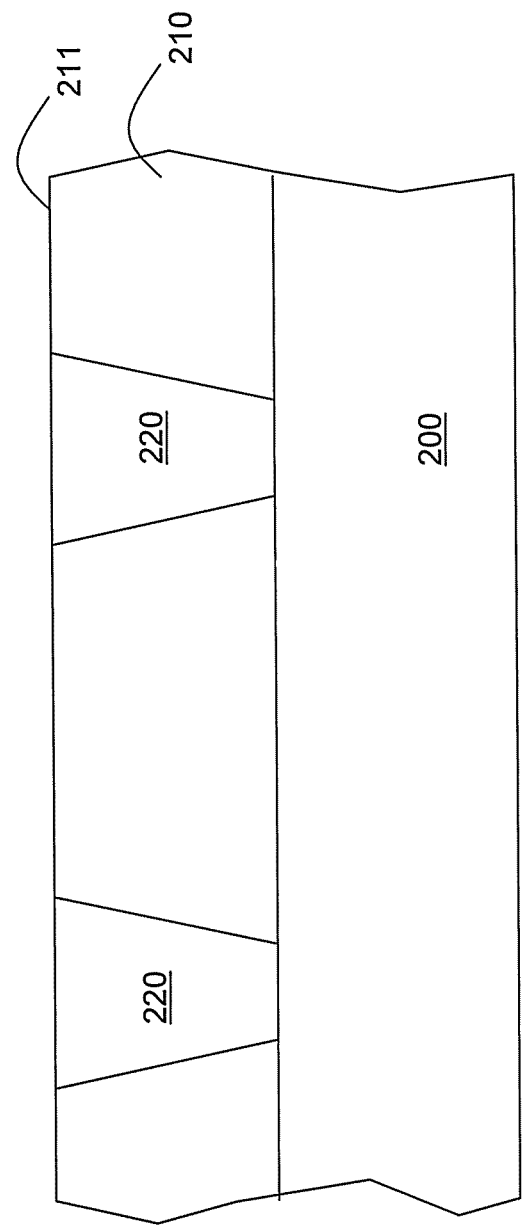
FIGS. 2A-2G are schematic cross-sectional views showing an exemplary method for forming an interconnect structure.

Referring to FIG. 2A, a dielectric layer 210 is formed over a substrate 200. At least one conductive structure 220 is formed within the dielectric layer.

The substrate 200 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, at least one diode, transistor, device, circuit, metallic layer, or the like or combinations thereof (not shown) is formed over the substrate 200 and coupled to the conductive structures 220.

The dielectric layer 210 may be, for example, a silicon oxide layer, a silicon nitride layer, a silicon oxynitride layer, a low-k dielectric layer, an ultra low-k dielectric layer, or the like or combinations thereof. The dielectric layer 210 may be formed by, for example, a chemical vapor deposition (CVD) process.

The conductive structures 220 may be contacts, vias, damascene structures, dual damascene structures, or the like or combinations thereof. In some embodiments, the conductive structures 220 may comprise a barrier layer (not shown) such as a titanium (Ti) layer, a titanium nitride (TiN) layer, a tantalum (Ta) layer, a tantalum nitride (TaN) layer, or other material layer that is adequate to isolate the conductive structures 220 from the dielectric layer 210 or combinations thereof. In some embodiments, the conductive structures 220 may comprise a conductive material such as copper (Cu), aluminum (Al), AlCu, AlSiCu, polysilicon, tungsten (W), or the like or combinations thereof. In some embodiments, the barrier layer (not shown) is formed around the conductive material (not shown). The conductive structures 220 may be formed by, for example, a CVD process, a physical vapor deposition (PVD) process, an electroplating process, an electroless plating process, or the like or combinations thereof.

The process for forming the conductive structures 220 within the dielectric layer 210 may comprise, for example, forming openings (not shown) within the dielectric layer 210. The barrier layer (not shown) and the conductive material (not shown) are then sequentially formed within the openings and covering the dielectric layer 210. An etch process or a chemical mechanical polishing (CMP) process then removes a portion of the conductive material and a portion of the barrier layer over the surface 211 of the dielectric layer 210. The remaining barrier layer and conductive material constitute the conductive structures 220.

In some embodiments for using 45-nm technology, the height of the conductive structures 220 is between about 1,000 Å and about 2,000 Å. The scope of the invention of this application, however, is not limited by the dimensions described in FIG. 2A.

Figure 2B:
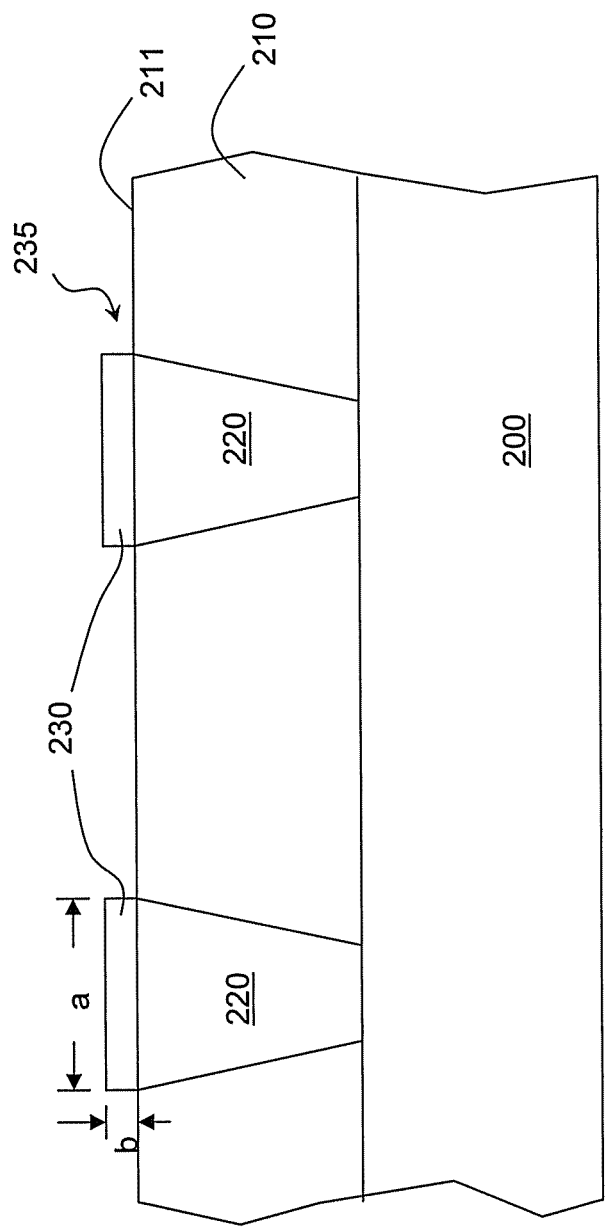

Referring to FIG. 2B, conductive layers 230 are formed on the respective conductive structures 220 such that the conductive layers 230 and the conductive structures 220 constitute conductive structures 235. In other words, the conductive structures 235 may comprise the conductive structures 220 and the conductive layers 230. The conductive layer 230 is the cap portion of the conductive structure 235. In some embodiments, the conductive layers 230 are generally referred to as metal cap layers. The material of the conductive layers 230 may comprise, for example, cobalt tungsten (CoW), cobalt tungsten phosphorus (CoWP), copper silicon nitride (CuSiN), or the like or combinations thereof. The conductive layers 230 may be formed by, for example, an electroless plating process such that the conductive layers 230 are substantially formed on the surfaces of the conductive structures 220, and not on the surface of the dielectric layer 210.

Referring again to FIG. 2B, the conductive layers 230, i.e., the cap portion of the conductive structures 235, are above a level of the top surface 211 of the dielectric layer 210. In some embodiments using 45-nm technology, the conductive layers 230 may have a width "a" between about 50 nanometer (nm) and about 100 nm. The conductive layers 230 may have a height "b" between about 50 Å and about 200 Å. The scope of the invention of this application, however, is not limited by the dimensions described in FIG. 2B.

Figure 2C:
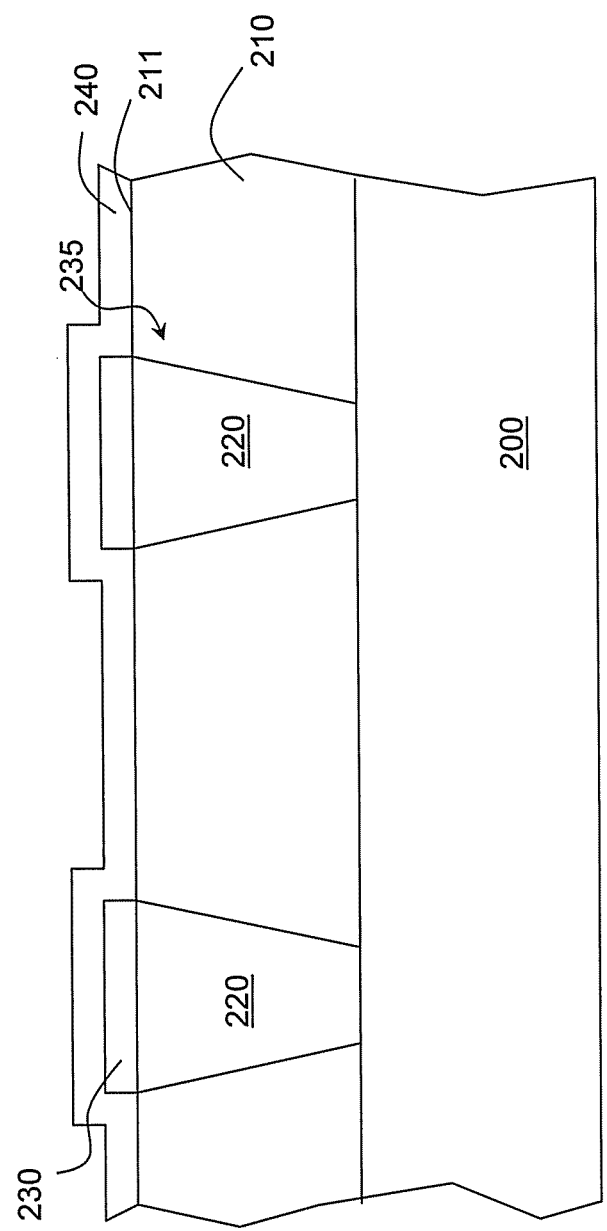

Referring to FIG. 2C, a dielectric layer 240 is formed and is substantially conformal over the structure shown in FIG. 2B. The dielectric layer 240 may cover the conductive structures 235 and the dielectric layer 210. In some embodiments, the dielectric layer 240 is generally referred to as an etch stop layer (ESL). The dielectric layer 240 may comprise, for example, a silicon carbon nitride (SiCN) layer, a silicon carbon oxide (SCO) layer, an oxide layer, a nitride layer, an oxynitride layer or other dielectric layer that has different etch selectivity with respect to the dielectric layer 210, or combinations thereof. The dielectric layer 240 may be formed by, for example, a CVD process.

In some embodiments for using 45-nm technology, the dielectric layer 240 may have a thickness between about 50 Å and about 400 Å. The scope of the invention of this application, however, is not limited by the dimensions described in FIG. 2C.

Figure 2D:
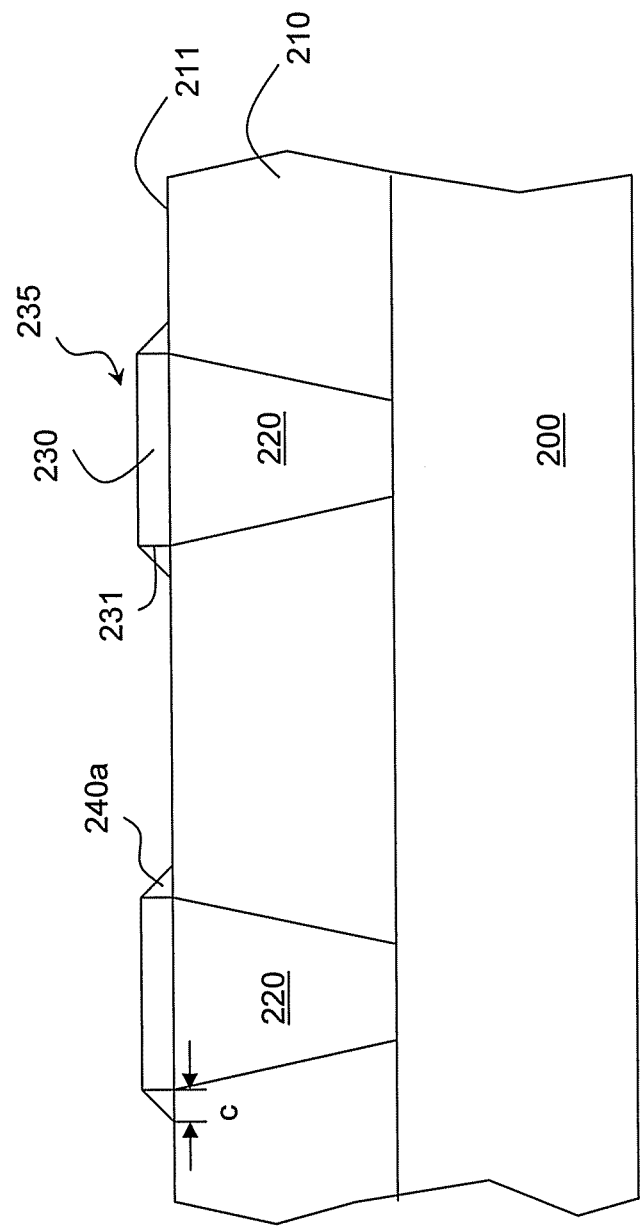

Referring to FIG. 2D, a removing process such as an etch process may be used to remove a portion of the dielectric layer 240 so as to form spacers 240a on the sidewalls 231 of the conductive structure 230, i.e., the cap portion of the conductive structure 235. In some embodiments using 45-nm technology, the spacers 240a may have a width "c" at the interface of the spacers 240a and the dielectric layer 210. The width "c" may be between about 50 Å and about 250 Å. The scope of the invention of this application is not limited by the dimensions described in FIG. 2D.

Figure 2E:
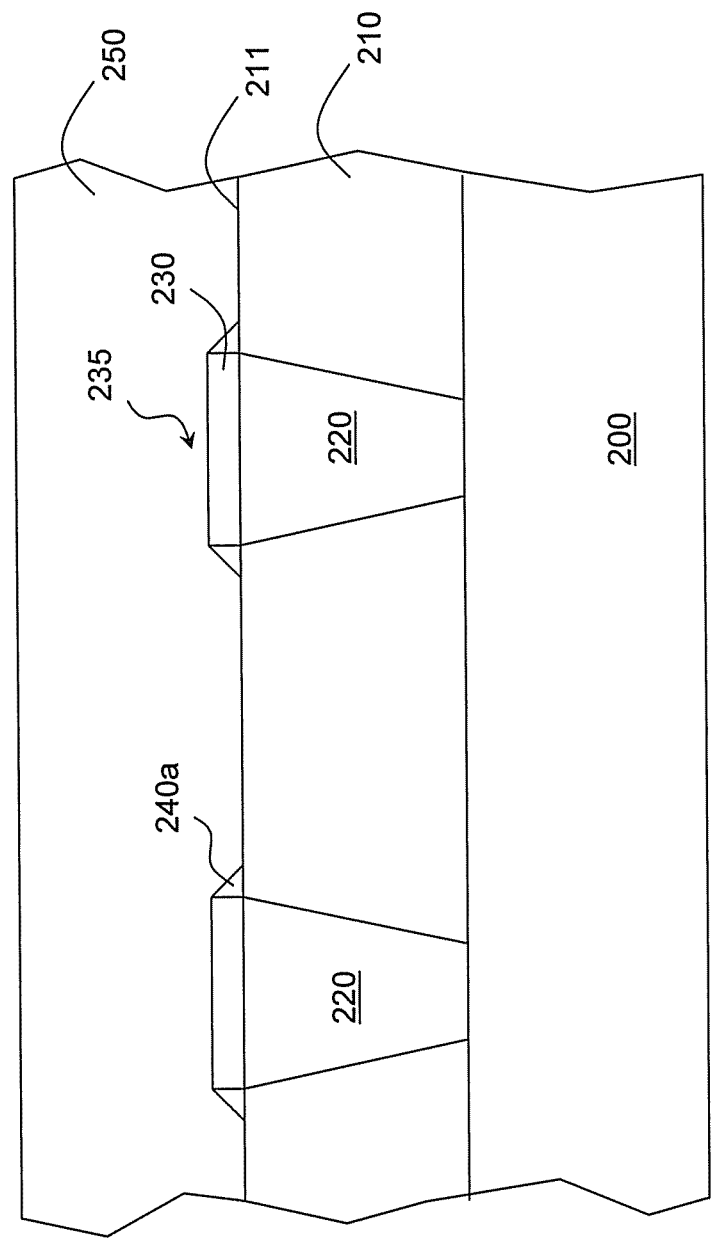

Referring to FIG. 2E, a dielectric layer 250 is formed and covers the spacers 240a, the conductive structures 235 and the dielectric layer 210. The dielectric layer 250 may be, for example, a silicon oxide layer, a silicon nitride layer, a silicon oxynitride layer, a low-k dielectric layer, an ultra low-k dielectric layer, or the like or combinations thereof. The dielectric layer 250 may be formed by, for example, a CVD process or a spin-coating process.

Figure 2F:
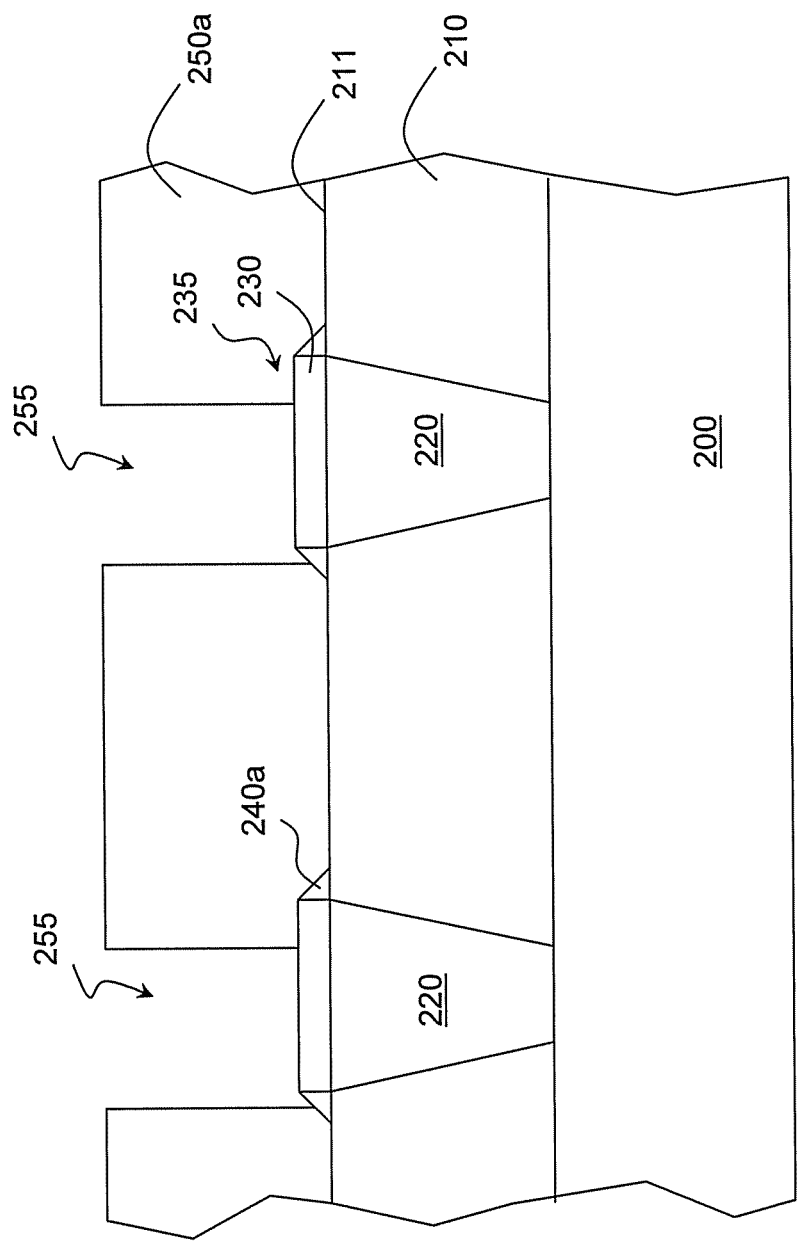

Referring to FIG. 2F, openings 255 are formed within the dielectric layer 250. The process for forming the openings 255 may comprise, for example, forming a patterned photoresist layer (not shown) having opening corresponding to the openings 255 over the dielectric layer 250 (shown in FIG. 2E). An etch process removes a portion of the dielectric layer 250 by using the patterned photoresist layer (not shown) as a mask so as to form forming the openings 255. The remaining dielectric layer 250 constitutes the dielectric layer 250a. After the etch process, the patterned photoresist layer is removed by, for example, a photolithographic removal process.

Figure 1B:
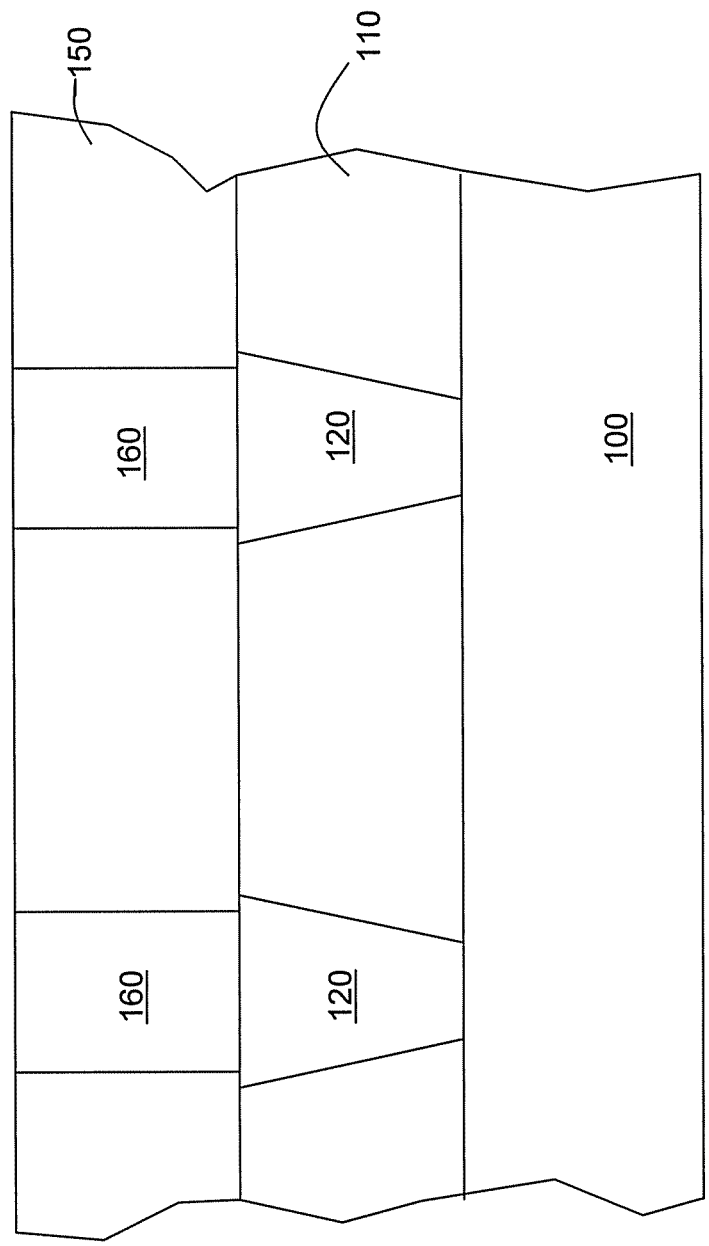
FIG. 1B is a schematic cross-sectional view showing another traditional interconnect structure.
Figure 2G:
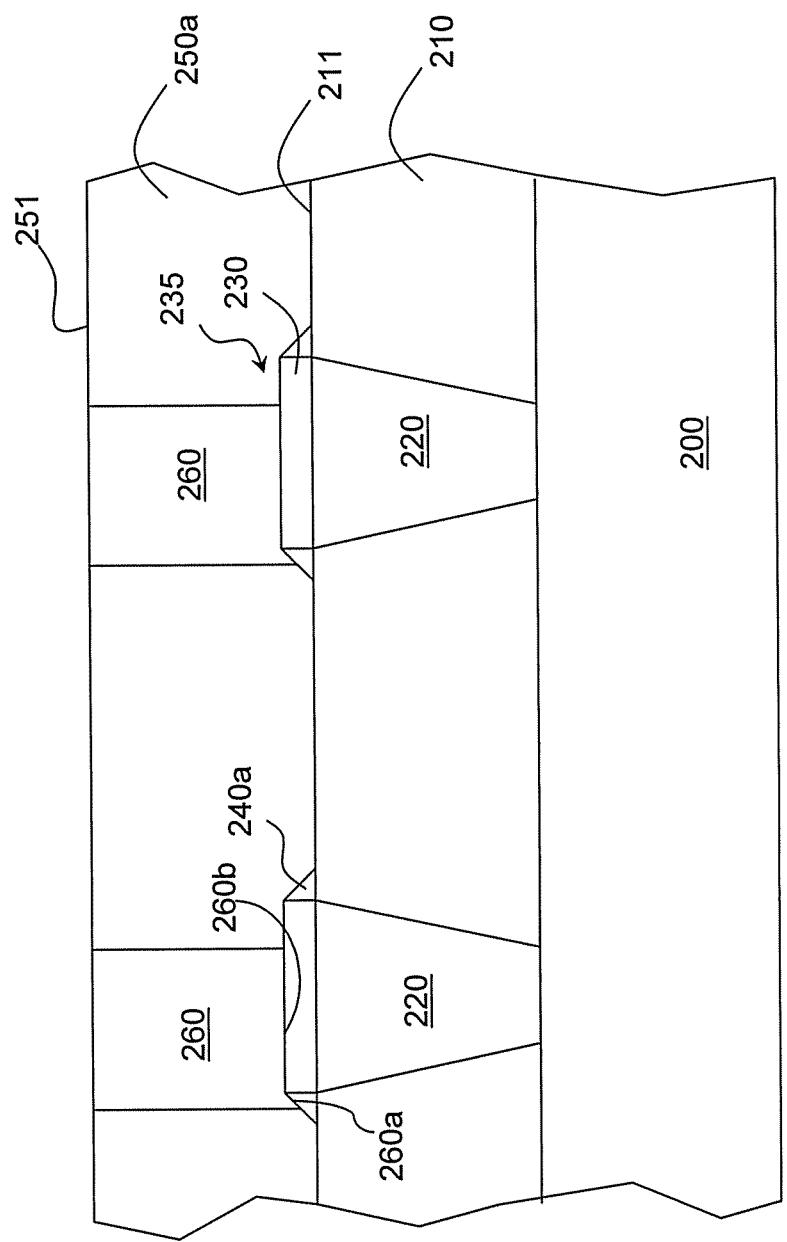
Figure 2H:
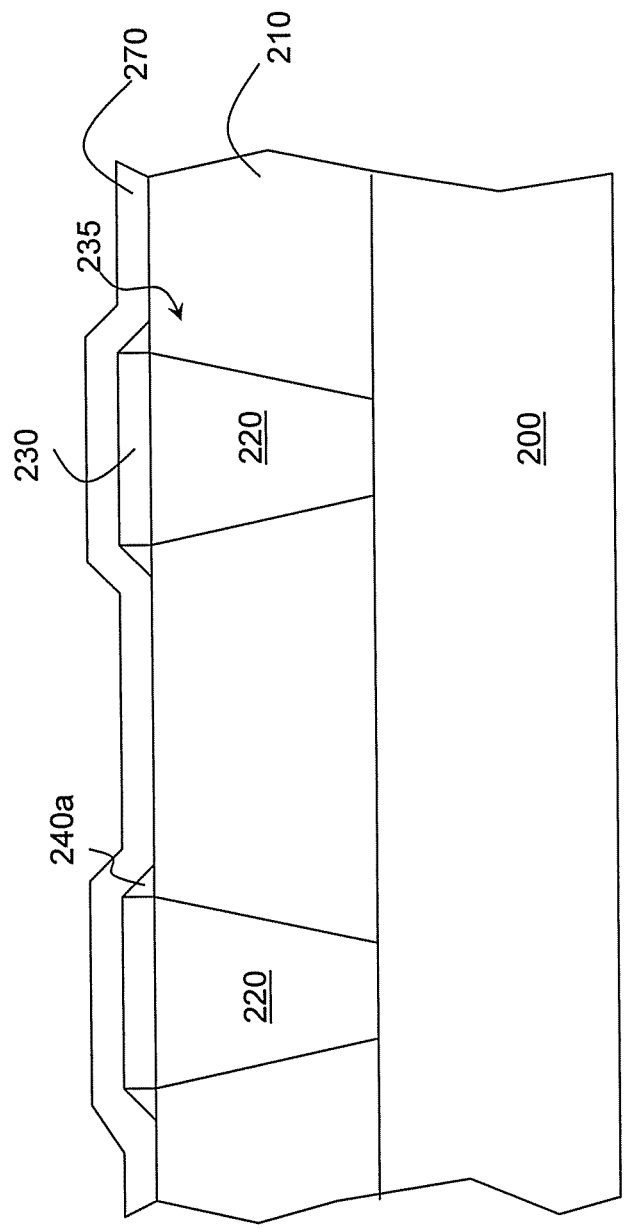
Figure 21:
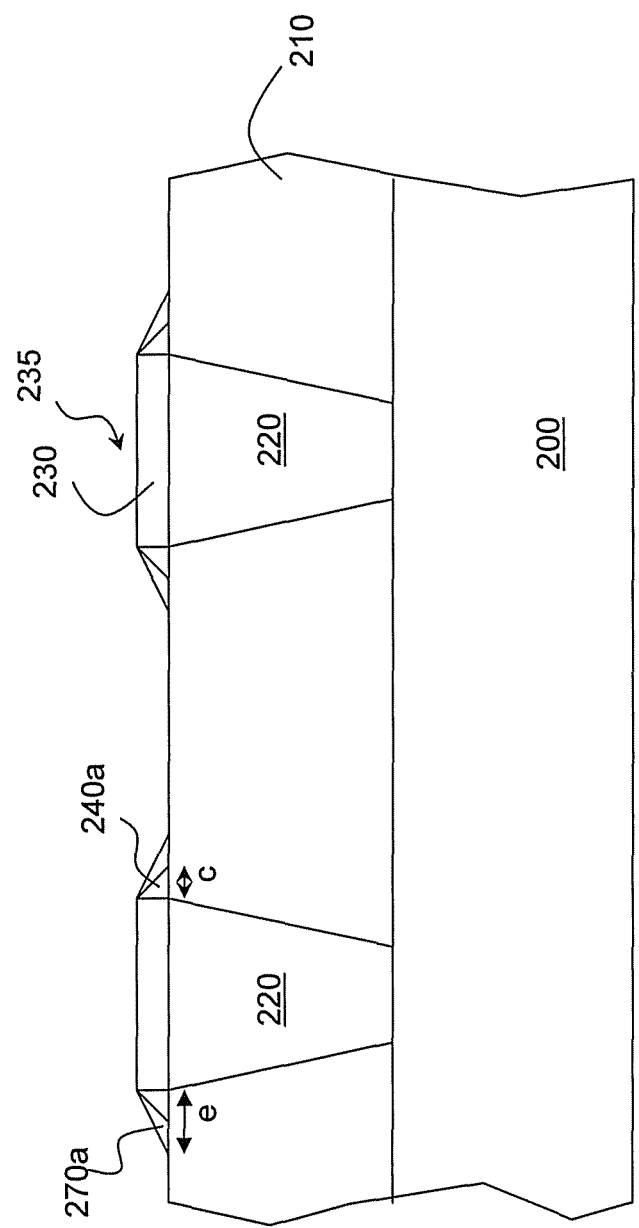
Figure 2J:
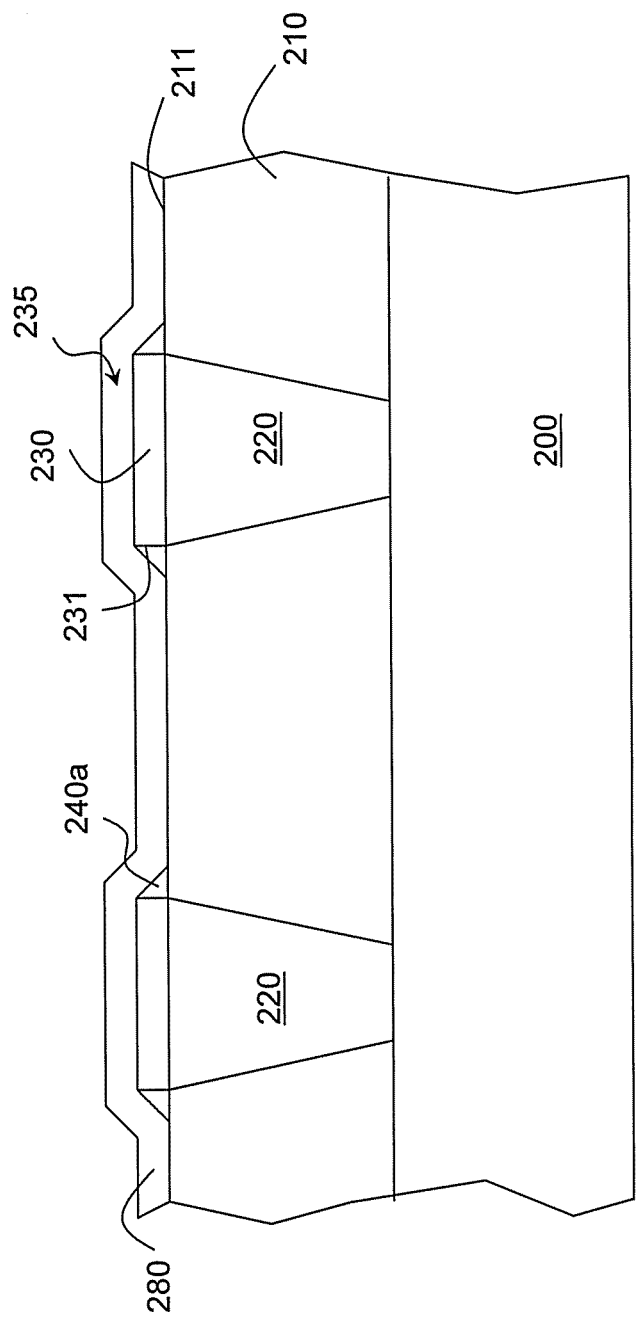
FIG. 2J is a schematic cross-sectional view showing an exemplary interconnect structure.
Figure 2K:
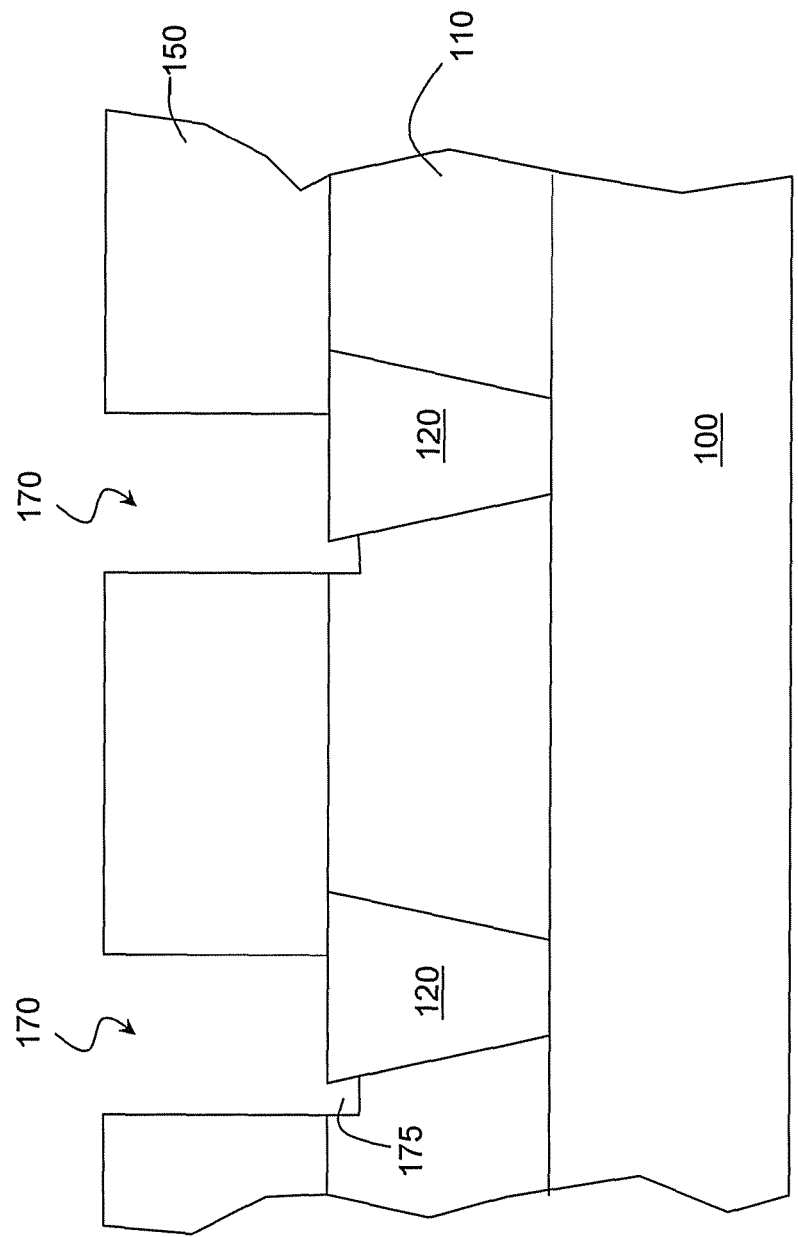
FIG. 2K is a schematic cross-sectional view showing the interconnect structure (shown in FIG. 1B) with misalignment.

FIG. 2K is a schematic cross-sectional view showing the interconnect structure (shown in FIG. 1B) with misalignment.

It is found that when misalignment occurs, the dielectric layer 110 (shown in FIG. 2K) is subjected to damage when an etch process is conducted to form openings 170 in which the conductive structures 160 (shown in FIG. 1A) are to be formed. Without the etch stop layer 130 (shown in FIG. 1A), the etch process may overetch the dielectric layer 110, resulting in holes and/or gaps 175 formed within the dielectric layer 110. When the barrier layer (not shown) or the conductive material (not shown) described in FIG. 2G are filled within the openings 170, fill-in of the barrier layer (not shown) or the conductive material (not shown) in the holes and/or gaps 175 becomes an issue. Unfilled holes or gaps 175 may still exist after the formation of the barrier layer (not shown) or the conductive material (not shown). The unfilled holes and/or gaps 175 may adversely affect the reliability of the interconnect structure.

Unlike the interconnect structure shown in FIG. 2K, the dielectric spacers 240a can desirably solve the problem associated with misalignment. Referring again to FIG. 2F, misalignment occurs between the openings 255 and the conductive structures 235, i.e., the conductive layers 230. The openings 255 expose a portion (not labeled) of the top surfaces of the conductive layers 230 and a portion of the top surfaces of the dielectric spacers 240a. The etch process described in FIG. 2F has a lower removal rate for the dielectric spacers 240a (such as SiOC or SiON) than for the dielectric layer 250 or 210 (such as low-k material). The dielectric spacers 240a may desirably protect the underlying dielectric layer 210 from damage by the etch process. Accordingly, the misalignment margin between the openings 255 and the conductive structures 235 can be desirably achieved.

Referring to FIG. 2G, conductive structures 260 are formed within the openings 255. The conductive structures 260 may be contacts, vias, damascene structures, dual damascene structures, or the like or combinations thereof. In some embodiments, the conductive structures 260 may comprise a barrier layer (not shown) such as a titanium (Ti) layer, a titanium nitride (TiN) layer, a tantalum (Ta) layer, a tantalum nitride (TaN) layer, or other material layer that is adequate to isolate the conductive structures 260 from the dielectric layer 250 or combinations thereof. In some embodiments, the conductive structures 260 may comprise a conductive material (not shown) such as copper (Cu), aluminum (Al), AlCu, AlSiCu, polysilicon, tungsten (W), or the like or combinations thereof. In some embodiments, the barrier layer is formed around the conductive material. The conductive structures 260 may be formed by, for example, a CVD process, a physical vapor deposition (PVD) process, an electroplating process, an electroless plating process, or the like or combinations thereof.

The process of forming the conductive structures 260 within the openings 255 may comprise, for example, forming the barrier layer (not shown) and the conductive material (not shown) sequentially within the openings 255 so as to cover the dielectric layer 250a. An etch process or a chemical mechanical polishing (CMP) process then removes a portion of the conductive material and a portion of the barrier layer over the surface 251 of the dielectric layer 250a. The remaining barrier layer (not shown) and conductive material (not shown) constitute the conductive structures 260.

Referring again to FIG. 2G, a portion 260b of the bottom surface of the conductive structure 260 contacts the conductive layer 230 and another portion 260a of the bottom surface of the conductive structure 260 contacts the dielectric spacer 240a. The dielectric spacers 240a may have a dielectric constant higher than those of the dielectric layers 210 and 250a.

FIGS. 2H and 2I are schematic cross-sectional views showing an exemplary method for forming multiple spacers on sidewalls of the cap portion of the conductive structure.

Referring to FIG. 2H, a dielectric layer 270 is formed to be substantially conformal over the structure shown in FIG. 2D. The dielectric layer 270 may cover the conductive structures 235, the dielectric spacers 240a and the dielectric layer 210. In some embodiments, the dielectric layer 270 is generally referred to as an etch stop layer (ESL). The dielectric layer 270 may comprise, for example, a silicon carbon nitride (SiCN) layer, a silicon carbon oxide (SCO) layer, an oxide layer, a nitride layer, an oxynitride layer or other dielectric layer that has different etch selectivity with respect to the dielectric layer 210, or combinations thereof. The dielectric layer 270 may be formed by, for example, a CVD process.

Referring to FIG. 2I, an etch process may be used to remove a portion of the dielectric layer 270 so as to form spacers 270a on the sidewalls of the dielectric spacers 240a. By forming the second dielectric spacers 270a, the width "e" of the spacer 270a is larger than the width "c" (shown in FIG. 2D) of the spacer 240a. Accordingly, the misalignment margin between the openings 255 (shown in FIG. 2F) and the conductive layers 230 may be further desirably achieved. In other words, the etch process described in FIG. 2F may form the openings 255 without substantially damaging the dielectric layer 210 underlying the dielectric spacers 240a and/or 270a.

In some embodiments, the structure shown in FIG. 2I may be incorporated with the processes described in FIGS. 2E-2G so as to form a desired interconnect structure.

FIG. 2J is a schematic cross-sectional views showing an exemplary interconnect structure.

Referring to FIG. 2J, a glue layer 280 is formed over the structure shown in FIG. 2D. The glue layer 280 may cover the conductive structures 235, the dielectric spacers 240a and the dielectric layer 210. The glue layer 280 may be disposed to achieve a desired adhesion between the dielectric spacers 240a and the dielectric layer 250 (shown in FIG. 2E).

In some embodiment, the glue layer 280 may be, for example, a silicon oxide layer, a silicon oxycarbide (SiCO), or the like or various combinations thereof. In some embodiments for using 45-nm technology, the glue layer 280 may have a thickness of about 150 Å or less. In some embodiments, the glue layer 280 may have a dielectric constant higher than that of the dielectric layers 210 and/or 250a (shown in FIG. 2G).

As described above, the dielectric spacers 240a are formed under the glue layer 280 and around the sidewalls of the conductive layers 230, i.e., the cap portions of the conductive structures 235. The increase of parasitic capacitances of the interconnect structure by the dielectric spacers 240a can be desirably controlled.

For example, the overall parasitic capacitance of the interconnect structure of FIG. 1A is about 0.165 pico-fara (pF) and an intra parasitic capacitance between adjacent conductive structures 120 is about 0.137 (pF). The overall parasitic capacitance of the interconnect structure of FIG. 2J is about 0.147 (pF) and an intra parasitic capacitance between adjacent conductive structures 235 is about 0.128 (pF). Accordingly, the exemplary interconnect structures shown in FIGS. 2A-2J may have parasitic capacitances lower than those of the interconnect structure shown in FIG. 1A.

In some embodiments, the structure shown in FIG. 2J may be incorporated with the processes described in FIGS. 2E-2G so as to form a desired interconnect structure.

FIGS. 3A-3H are schematic cross-sectional views showing another exemplary method for forming an interconnect structure.

Figure 3A:
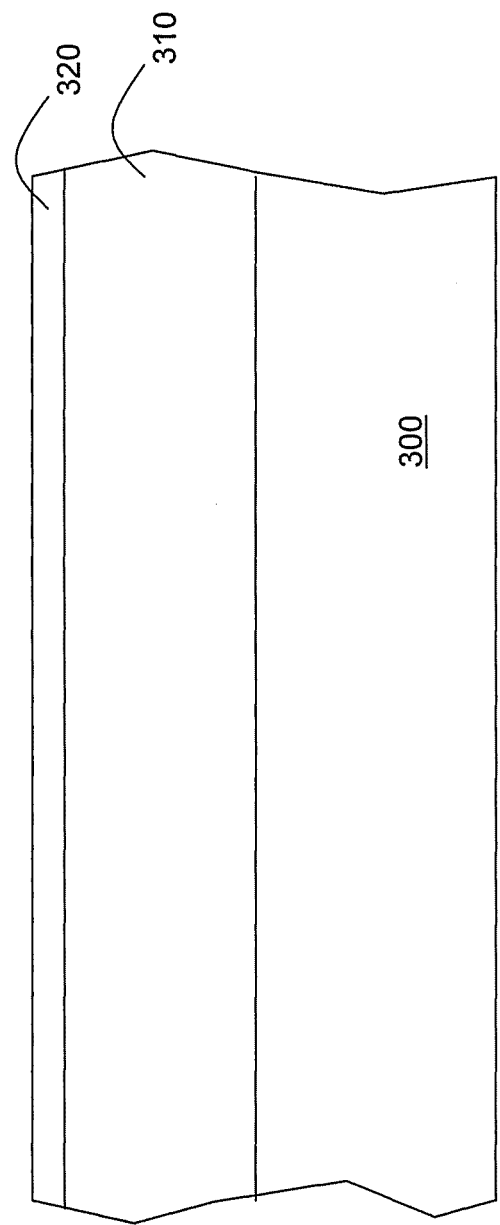
FIGS. 3A-3H are schematic cross-sectional views showing another exemplary method for forming an interconnect structure.

Referring to FIG. 3A, a dielectric layer 310 and a stop layer 320 are sequentially formed over a substrate 300. In some embodiments, the substrate 300 and the dielectric layer 310 may be similar to the substrate 200 and the dielectric layer 210 described in FIG. 2A.

Figure 3B:
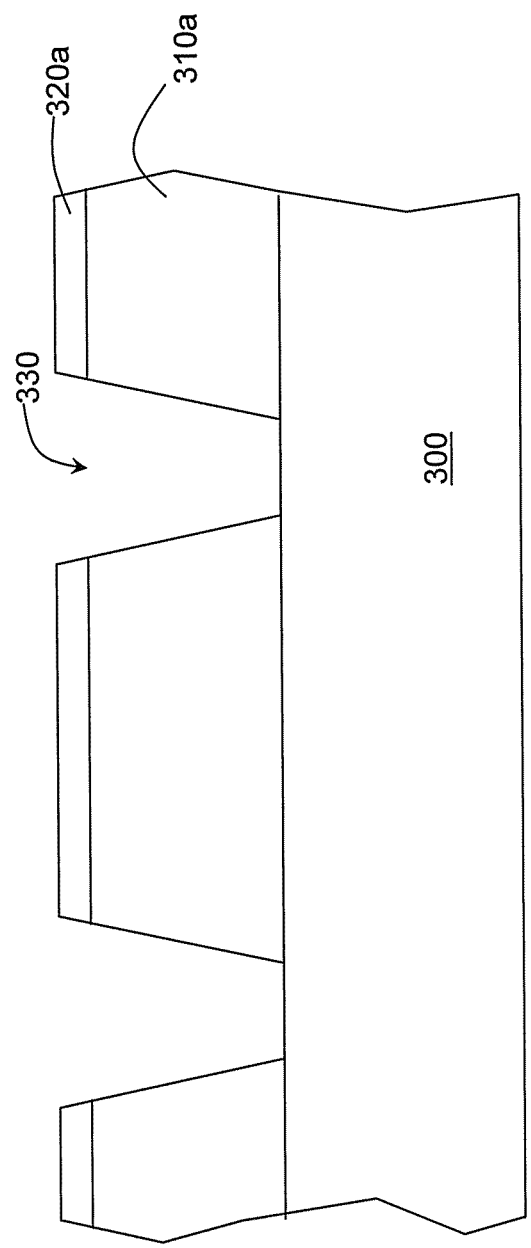
Figure 3C:
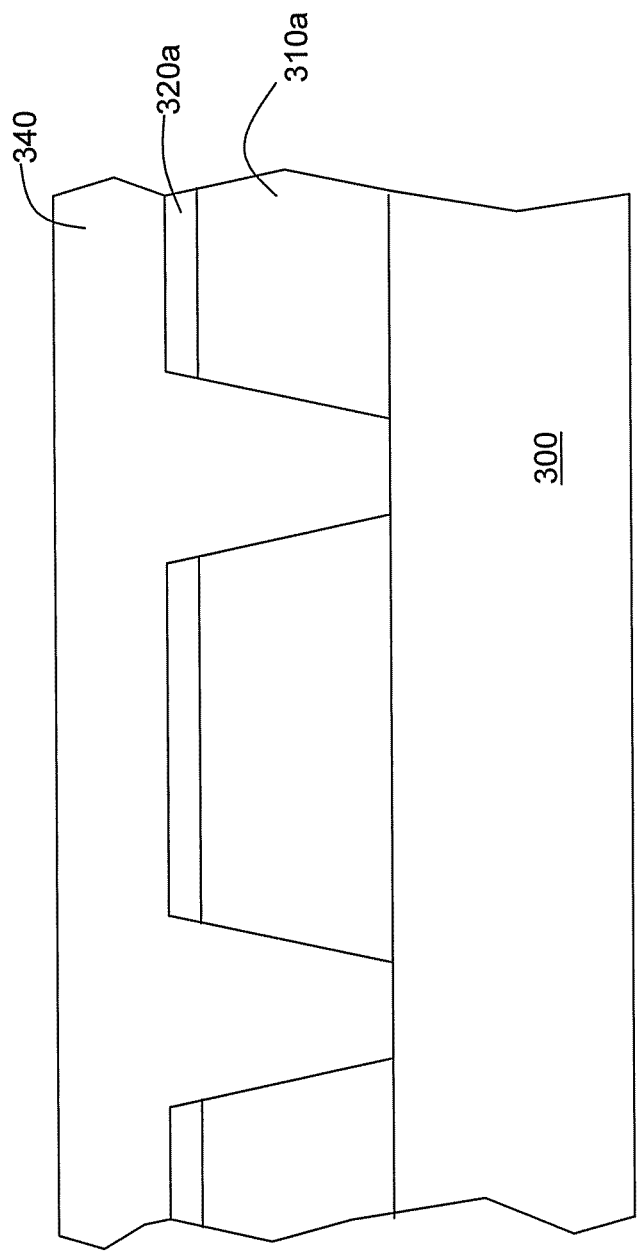
Figure 3D:
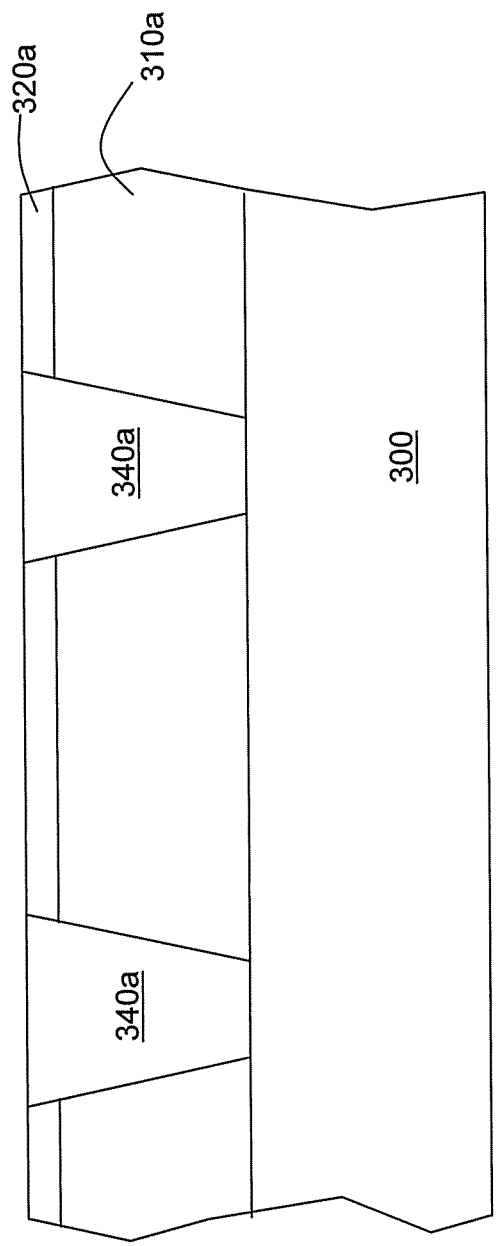

The stop layer 320 may be, for example, an oxide layer, a nitride layer, an oxynitride layer or other material layer that is adequate to be an etch stop layer or a CMP stop layer (used in FIG. 3D). In some embodiments, the stop layer 320 may be formed by, for example, a CVD process.

In some embodiments for using 45-nm technology, the thickness of the stop layer 320 may be between about 50 Å and about 200 Å. The scope of the invention of this application, however, is not limited by the dimensions described in FIG. 3A.

Referring to FIG. 3B, openings 330 are formed within the stop layer 320a and the dielectric layer 310a. The process for forming the openings 330 may comprise, for example, forming a patterned photoresist layer (not shown) having opening (not shown) corresponding to the openings 330 over the stop layer 320 (shown in FIG. 3A). An etch process removes a portion of the stop layer 320 and a portion of the dielectric layer 310 by using the patterned photoresist layer (not shown) as a mask so as to form the stop layer 320a and the dielectric layer 310a. After the etch process, the patterned photoresist layer may be removed by, for example, a photolithographic removal process.

Referring to FIG. 3C, a conductive material 340 is filled within the openings 330 and formed over the stop layer 320a. In some embodiments, a barrier layer (not shown) is formed between the stop layer 320a and the conductive material 340. The barrier layer (not shown) may be, for example, a titanium (Ti) layer, a titanium nitride (TiN) layer, a tantalum (Ta) layer, a tantalum nitride (TaN) layer, or other material layer that is adequate to isolate the conductive material 340 from the dielectric layer 310a, or combinations thereof. In some embodiments, the conductive material 340 may comprise a conductive material such as copper (Cu), aluminum (Al), AlCu, AlSiCu, polysilicon, tungsten (W), or the like or combinations thereof. In some embodiments, the barrier layer (not shown) is formed around the conductive material 340 within the openings 330 (shown in FIG. 3B). The conductive material 340 may be formed by, for example, a CVD process, a physical vapor deposition (PVD) process, an electroplating process, an electroless plating process, or the like or combinations thereof.

Referring to FIG. 3D, an etch process or a CMP process is performed to remove a portion of the conductive material 340 (shown in FIG. 3C) so as to form the conductive structure 340a. The conductive structures and the stop layers 320a may have a substantially level surface. The stop layer 320a may be used as an etch stop layer or CMP stop layer such that the removing process can be monitored and stopped at a desired point. The stop layer 320a may protect the underlying dielectric layer 310 from damage that might be caused by the etch process or CMP process. In some embodiments, the etch process or CMP process may further remove a portion of the barrier layer (not shown) such that two adjacent conductive structures 340a are isolated from each other. The remaining barrier layer (not shown) and the remaining conductive material constitute the conductive structures 340a.

Figure 3E:
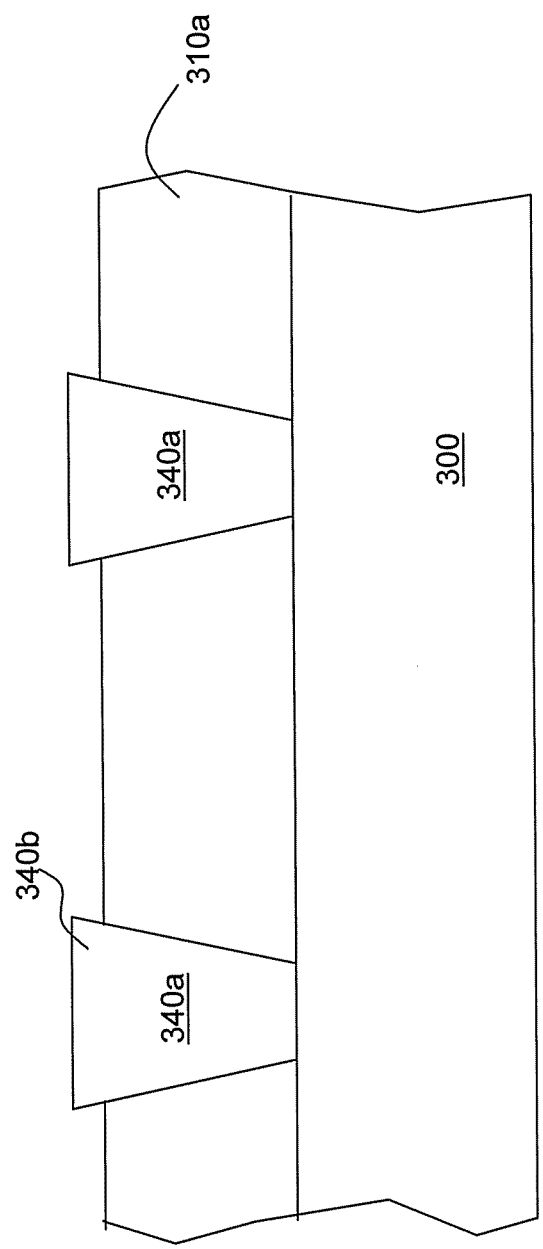

Referring to FIG. 3E, the stop layer 320a is removed so as to expose top portions 340b of the conductive structure 340a. The stop layer 320a may be removed by, for example, a dry etch process or a wet etch process. The step height of the conductive structure 340a and the dielectric layer 310a may be determined based on the thickness of the stop layer 320a after the CMP process or etch process described in FIG. 3D.

Figure 3F:
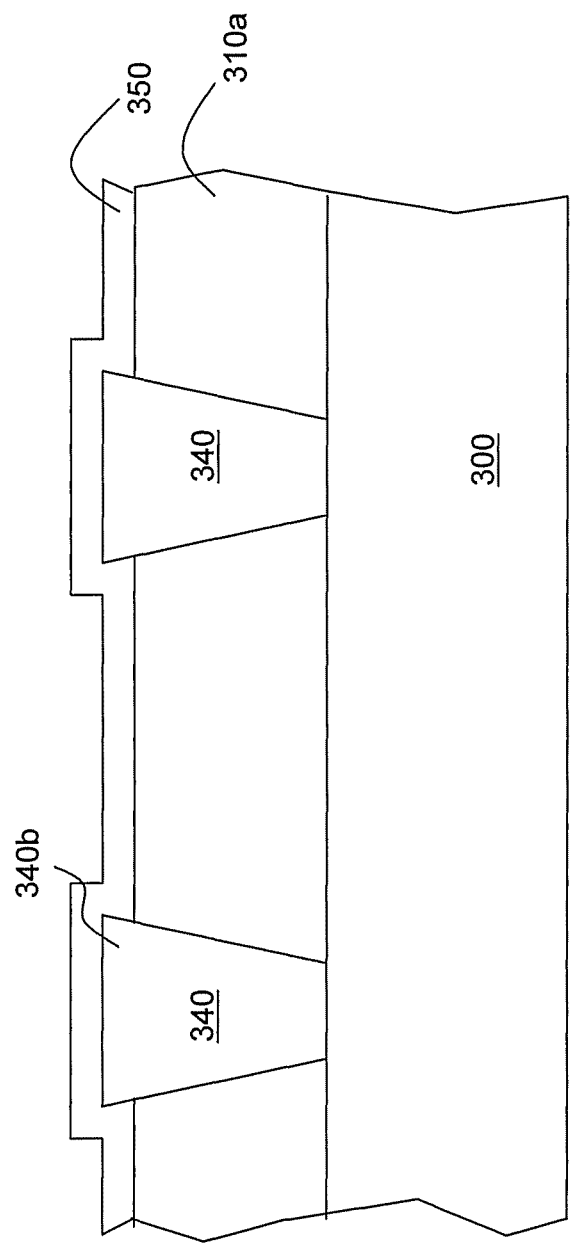

Referring to FIG. 3F, a dielectric layer 350 is formed over the structure shown in FIG. 3E and is substantially conformal over the conductive structures 340a and the dielectric layer 310a. In some embodiments, the dielectric layer 350 may be similar to the dielectric layer 240 described in FIG. 2C.

Figure 3G:
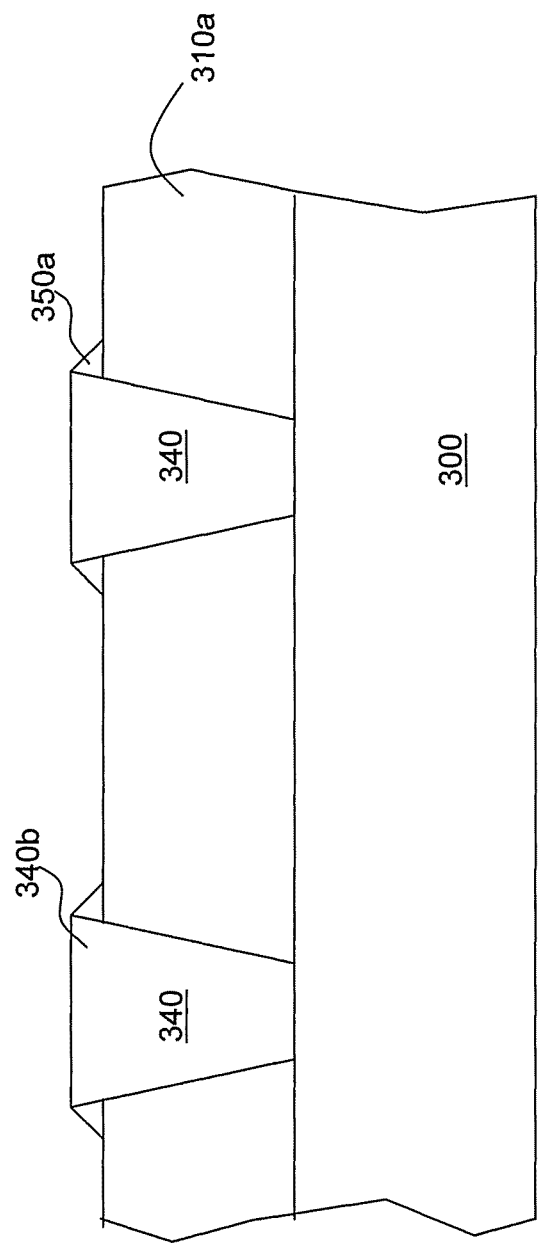

Referring to FIG. 3G, an etch process may be used to remove a portion of the dielectric layer 350 so as to form dielectric spacers 350a on the sidewalls of the cap portion 340b of the conductive structure 340a.

Figure 3H:
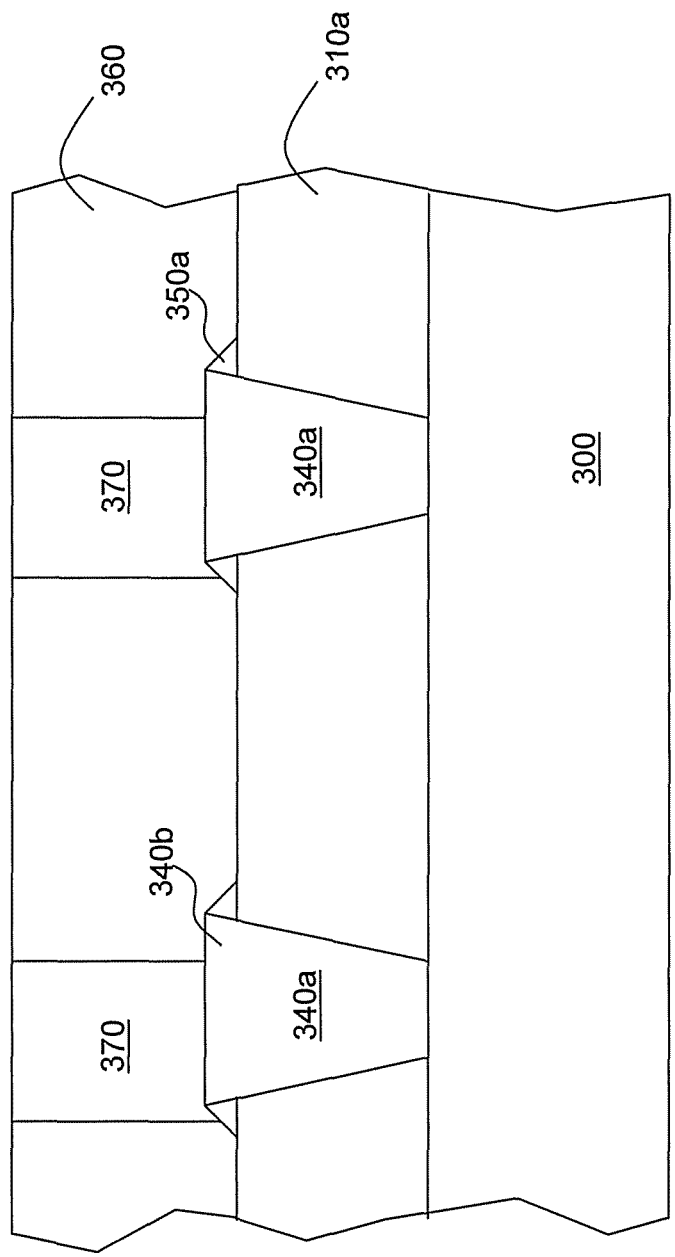

Referring to FIG. 3H, a dielectric layer 360 is formed over the structure shown in FIG. 3G and conductive structures 370 are formed within the dielectric layer 360. In some embodiments, the materials and methods for forming the dielectric layer 360 and the conductive structures 370 are similar to those of the dielectric layer 250a and the conductive structures 260 described in FIGS. 2F and 2G.

As described in FIGS. 2F and 2G, an etch process is provided to form openings (not shown) in which the conductive structures 370 are formed. The etch process has a lower removal rate to the dielectric spacer 350a than to the dielectric layer 310a or 360. The dielectric spacers 350a may desirably protect the underlying dielectric layer 310a from the damage resulting from the etch process for forming the openings (not shown) in which the conductive structures 370 are formed. Accordingly, the misalignment margin between the conductive structures 370 and the conductive structures 340 may be desirably achieved.

In some embodiments, the processes for forming the multiple spacer structure described in FIGS. 2H and 2I and/or the processes for forming the glue layer 280 described in FIG. 2K may be incorporated with the processes described in FIGS. 3A-3H.

FIGS. 4A-4E are schematic cross-sectional views showing an exemplary method for forming an interconnect structure.

Figure 4A:
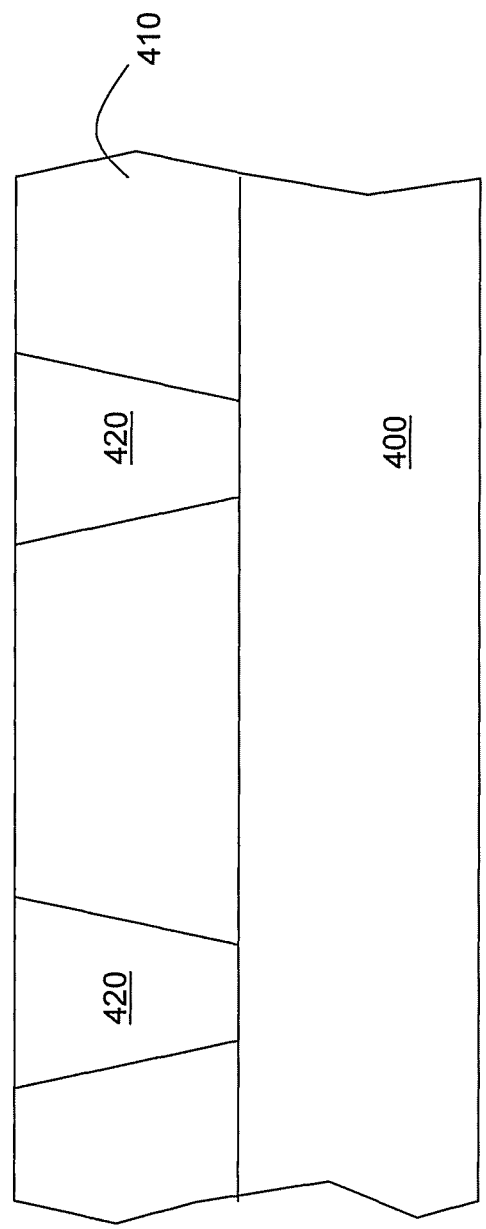
FIGS. 4A-4E are schematic cross-sectional views showing an exemplary method for forming an interconnect structure.

Referring to FIG. 4A, a dielectric layer 410 is formed over a substrate 400. At least one conductive structure 420 is formed within the dielectric layer 410. In some embodiments, the materials and methods for forming the substrate 400, dielectric layer 410 and conductive structures 420 may be similar to those of the substrate 200, dielectric layer 210 and conductive structures 220 described in FIG. 2A.

Figure 4B:
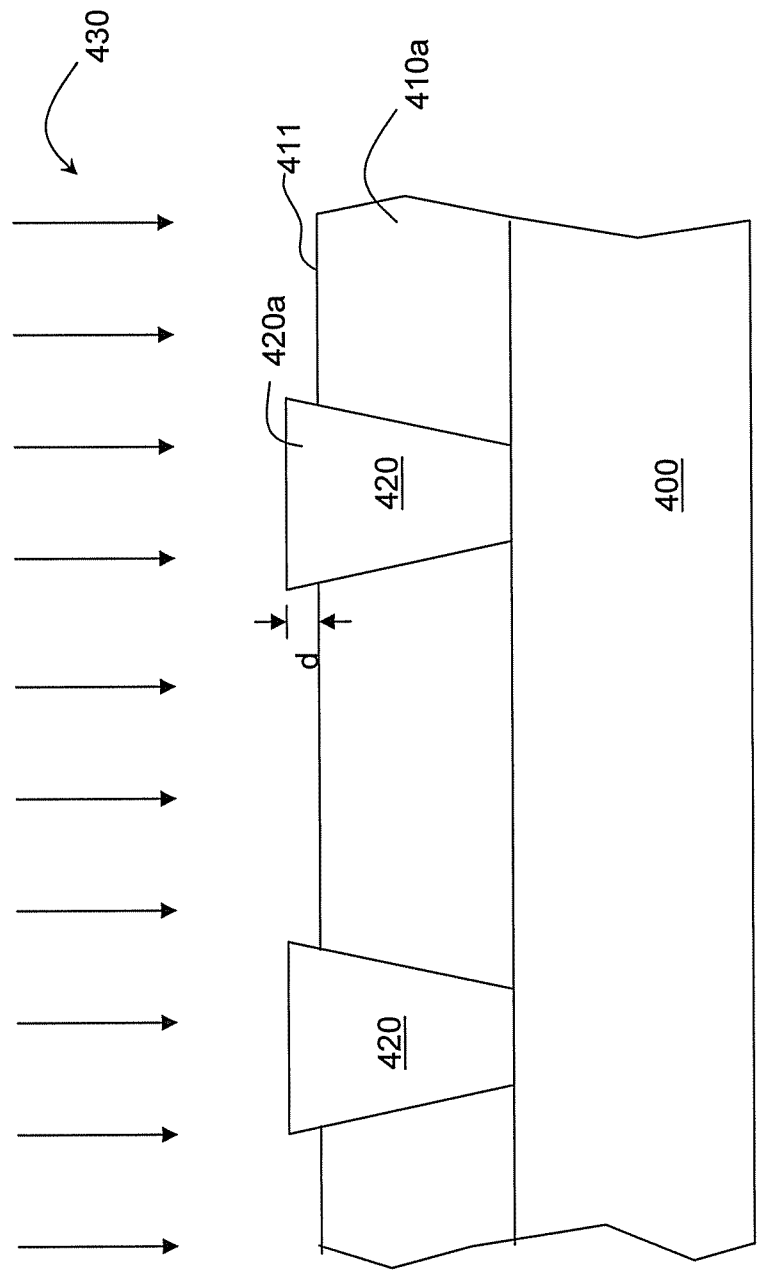

Referring to FIG. 4B, an etch process 430 such as a dry etch process and/or wet etch process is provided to remove a portion of the dielectric layer 410 so as to form the dielectric layer 410a and expose the top portions 420a of the conductive structures 420 over the surface 411 of the remaining dielectric layer 410a. The etch process 430 may use the conductive structures 420 as a hard mask to remove the portion of the dielectric layer 410. In this embodiment, the top portion 420a and the remainder (not labeled) of the conductive structures 420 have the same material.

In some embodiments using 45-nm technology, the step height "d" removed by the etch process 430 may be, for example, between about 50 Å and about 400 Å. In some embodiments, the etch process 430 may be a time-mode etch process such that the depth "d" is determined based on the etch rate multiplied by the etch time of the etch process 430.

Figure 4C:
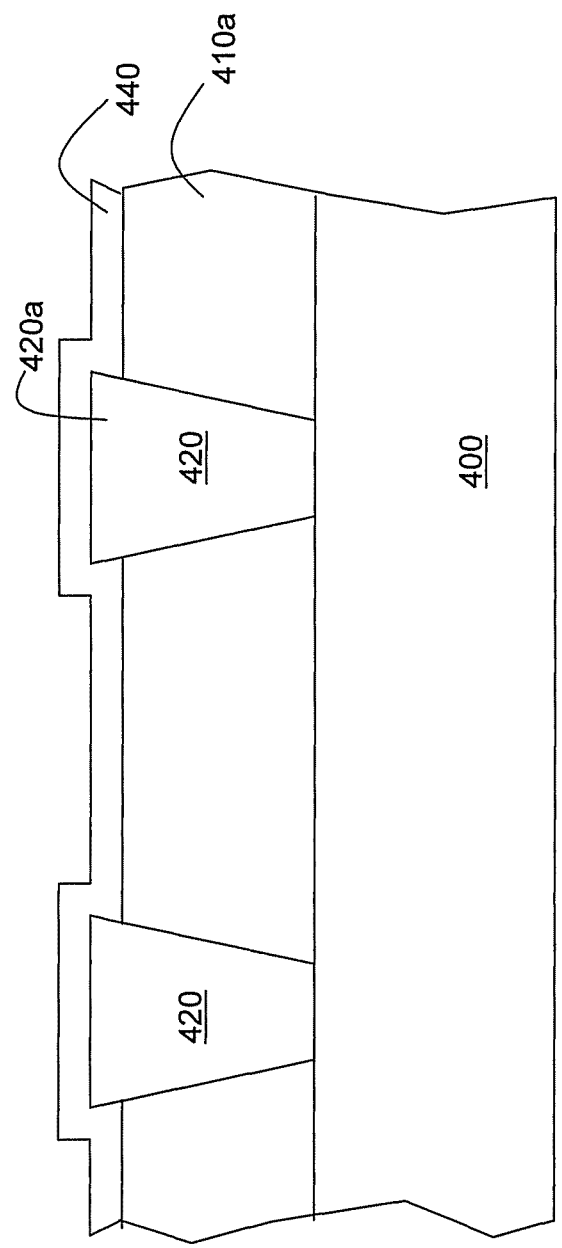

Referring to FIG. 4C, a dielectric layer 440 is formed over the structure shown in FIG. 4B and is substantially conformal over the conductive structures 420 and the dielectric layer 410a. In some embodiments, the materials and methods for forming the dielectric layer 440 may be similar to those of the dielectric layer 240 described in FIG. 2C.

Figure 4D:
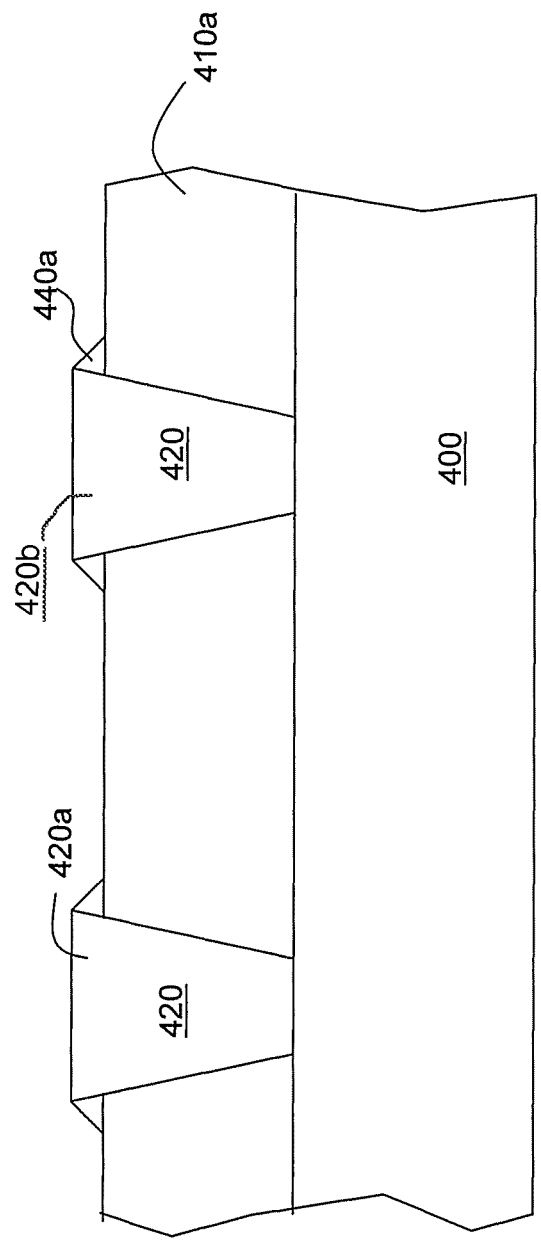

Referring to FIG. 4D, an etch process may be used to remove a portion of the dielectric layer 440 so as to form dielectric spacers 440a on the sidewalls (not labeled) of the cap portion 420b of the conductive structure 420.

Figure 4E:
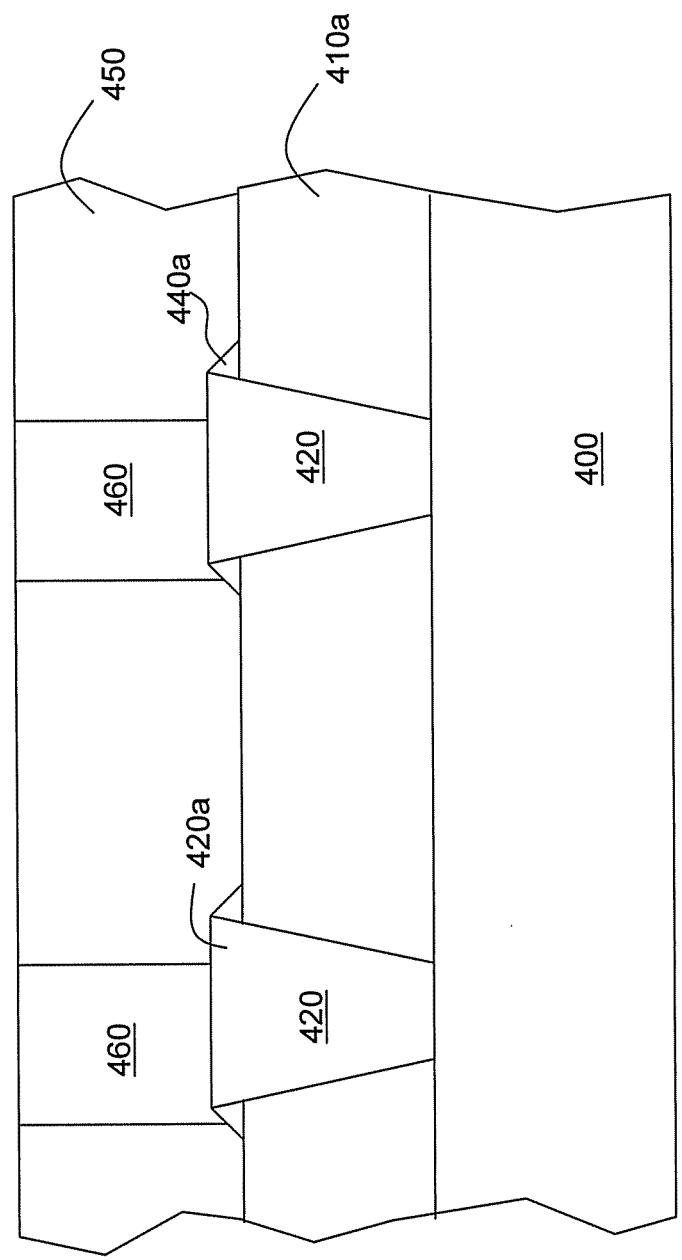

Referring to FIG. 4E, a dielectric layer 450 is formed over the structure shown in FIG. 4D and conductive structures 460 are formed within the dielectric layer 450. In some embodiments, the materials and methods for forming the dielectric layer 450 and the conductive structures 460 are similar to those of the dielectric layer 250a and the conductive structures 260 described in FIGS. 2F and 2G.

As described in FIGS. 2F and 2G, an etch process is conducted to form openings (not shown) in which the conductive structures 460 are formed. The etch process has a lower removal rate to the dielectric spacer 440a than to the dielectric layer 410a or 450. The dielectric spacers 440a may desirably protect the underlying dielectric layer 410a from the damage resulting from the etch process. Accordingly, the misalignment margin between the conductive structures 460 and the conductive structures 420 may be desirably achieved.

In some embodiments, the processes for forming the multiple spacer structure shown in FIGS. 2H and 2I and/or the processes for forming the glue layer 280 shown in FIGS. 2J-2L may be incorporated with the processes described in FIGS. 4A-4E.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A semiconductor structure, comprising:
   a first dielectric layer over a substrate;
   a first conductive structure within the first dielectric layer, the first conductive structure comprising a cap portion, wherein the cap portion extends above a level of a top surface of the first dielectric layer;
   a first dielectric spacer disposed on a sidewall of the cap portion of the first conductive structure;
   a second dielectric spacer disposed on the first dielectric spacer, wherein a maximum width of the second dielectric spacer is greater than a maximum width of the first dielectric spacer and wherein the second dielectric spacer has a different material composition than the first dielectric spacer;
   a second dielectric layer over the first conductive structure; and
   a second conductive structure within the second dielectric layer, at least a first portion of a bottom surface of the second conductive structure contacting a top surface of the first conductive structure and a second portion of the bottom surface of the second conductive structure directly contacting a top surface of the second dielectric spacer.

2. The semiconductor structure of claim 1, wherein the cap portion of the first conductive structure is a metallic cap layer.

3. The semiconductor structure of claim 1, wherein the cap portion of the first conductive structure and a remainder of the first conductive structure have an identical material composition.

4. The semiconductor structure of claim 1, wherein the second portion of the bottom surface of the second conductive structure contacts the first dielectric spacer and there is no glue layer between the first dielectric spacer and the second dielectric layer.

5. A semiconductor structure, comprising:
   a first conductive structure disposed within a first dielectric layer, the first dielectric layer being formed over a semiconductor substrate, the first conductive structure including a cap portion, wherein the cap portion extends above a top surface of the first dielectric layer;
   a first dielectric spacer disposed on a sidewall of the cap portion of the first conductive structure;
   a second dielectric spacer disposed on the first dielectric spacer, wherein a maximum width of the second dielectric spacer is greater than a maximum width of the first dielectric spacer and wherein the second dielectric spacer has a different material composition than the first dielectric spacer; and
   a second conductive structure disposed within a second dielectric layer, the second dielectric layer being disposed over the first dielectric layer such that at least a first portion of a bottom surface of the second conductive structure contacts a top surface of the first conductive structure and a second portion of the bottom surface of the second conductive structure directly contacts a top surface of the second dielectric spacer.

6. The semiconductor structure of claim 5, wherein the cap portion of the first conductive structure is a metallic cap layer.

7. The semiconductor structure of claim 5, wherein the cap portion of the first conductive structure and a remainder of the first conductive structure have an identical material composition.

8. The semiconductor structure of claim 5, wherein the second portion of the bottom surface of the second conductive structure contacts the first dielectric spacer and there is no glue layer between the first dielectric spacer and the second dielectric layer.

9. The semiconductor structure of claim 5, wherein the first dielectric spacer and the second dielectric spacer each comprises a material selected from a group consisting of silicon carbon nitride, silicon carbon oxide, an oxide, a nitride, and an oxynitride.

* * * * *